United States Patent [19]

Raamot

[11] 3,877,021

[45] Apr. 8, 1975

[54] DIGITAL-TO-ANALOG CONVERTER

[75] Inventor: Jaan Raamot, Princeton, N.J.

[73] Assignee: Western Electric Company, New York, N.Y.

[22] Filed: Mar. 2, 1973

[21] Appl. No.: 337,347

Related U.S. Application Data

[63] Continuation of Ser. No. 136,957, April 23, 1971, abandoned, which is a continuation-in-part of Ser. No. 805,543, March 10, 1969, abandoned.

[52] U.S. Cl. ........... 340/347 DA; 307/60; 323/22 T

[51] Int. Cl. ............................................ H03k 13/04

[58] Field of Search.......... 340/347 DA; 307/33, 60, 307/297; 321/17, 18; 323/4, 22 T, 15

[56] References Cited

UNITED STATES PATENTS

| | | | |
|---|---|---|---|
| 3,247,397 | 4/1966 | Kopek et al. | 340/347 DA |
| 3,343,073 | 9/1967 | Mesenhimer | 323/15 |
| 3,375,435 | 3/1968 | Baugher | 323/22 T X |
| 3,396,380 | 8/1968 | Ohashi | 340/347 DA |
| 3,403,393 | 9/1968 | Skrenes | 340/347 DA |
| 3,475,749 | 10/1969 | Plice | 340/347 DA |
| 3,544,994 | 12/1970 | Hanson et al. | 340/347 DA |
| 3,581,303 | 5/1971 | Kelly | 340/347 DA |
| 3,602,799 | 8/1971 | Guillen | 323/4 |
| 3,610,953 | 10/1971 | Gordon et al. | 340/347 DA |
| 3,685,045 | 8/1972 | Pastoriza | 340/347 DA |

OTHER PUBLICATIONS

Breedlove, "Ladder Decoder," IBM Technical Disclosure Bulletin, Vol. 3, No. 7, 12/1960, p. 17.

*Primary Examiner*—Thomas J. Sloyan
*Attorney, Agent, or Firm*—B. W. Sheffield; J. L. Stavert

[57] ABSTRACT

The invention comprises a digital-to-analog converter having a high degree of resolution. An unregulated voltage source supplies current to a network of binary-weighted resistors through a corresponding plurality of selectively actuated switching circuits. A novel parallel-current voltage regulating circuit is connected to a highly accurate reference voltage and regulates the voltage applied to each binary-weighted resistor, after the operation of the associated switching circuit. An 18-bit converter having an accuracy greater than 4 parts per million has been realized.

5 Claims, 10 Drawing Figures

FIG. 1b PRIOR ART
| DIGITAL INPUT | $S_1$ | $S_2$ | $S_3$ | $E_0$ |
|---|---|---|---|---|
| 000 | OPEN | OPEN | OPEN | 0=GROUND |
| 001 | OPEN | OPEN | CLOSED | 2/22 $E_{ref.}$ |
| 010 | OPEN | CLOSED | OPEN | 4/22 $E_{ref.}$ |
| 011 | OPEN | CLOSED | CLOSED | 6/22 $E_{ref.}$ |
| 100 | CLOSED | OPEN | OPEN | 8/22 $E_{ref.}$ |
| 101 | CLOSED | OPEN | CLOSED | 10/22 $E_{ref.}$ |
| 110 | CLOSED | CLOSED | OPEN | 12/22 $E_{ref.}$ |
| 111 | CLOSED | CLOSED | CLOSED | 14/22 $E_{ref.}$ |
FIG. 2 PRIOR ART
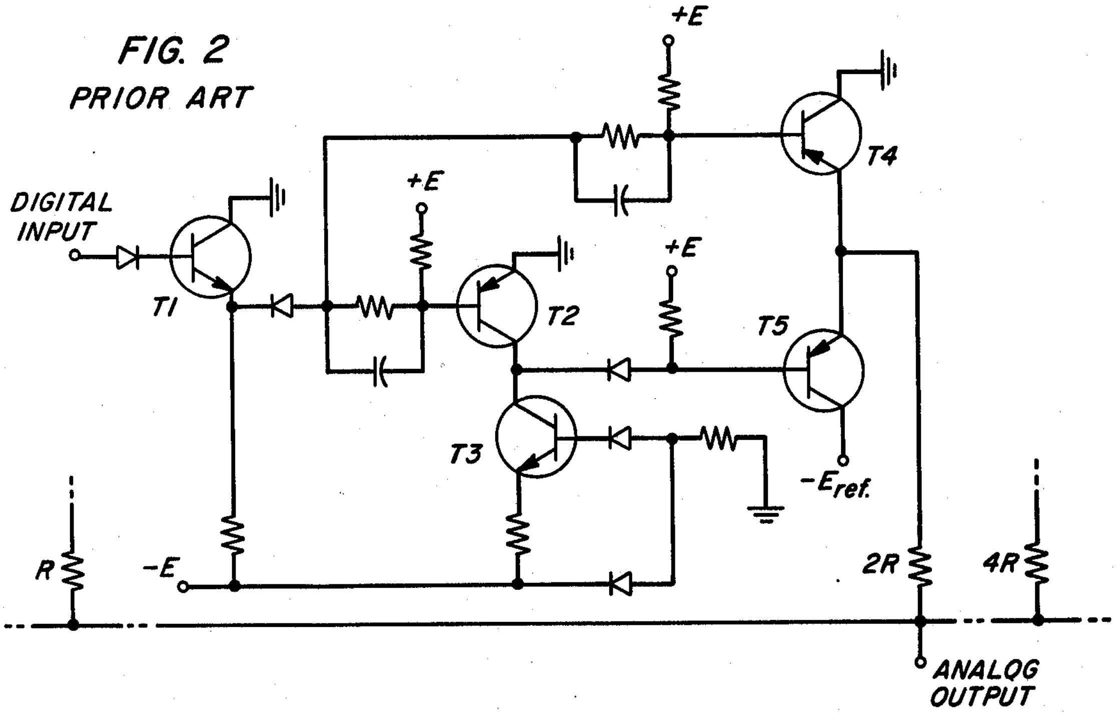
FIG. 1a PRIOR ART
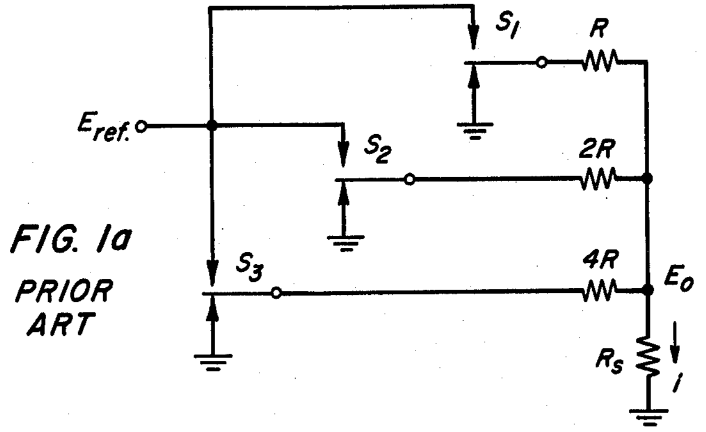
INVENTOR
J. RAAMOT
BY Bryan W. Sheffield
ATTORNEY

DIGITAL-TO-ANALOG CONVERTER

This is a continuation of application Ser. No. 136,957 filed Apr. 23, 1971 and now abandoned, which was a continuation-in-part of application Ser. No. 805,543 filed Mar. 10, 1969 and now abandoned.

BACKGROUND OF THE INVENTION

1. Field of the Invention

This invention relates to a digital-to-analog converter and more particularly to a digital-to-analog converter having a high degree of resolution.

2. Description of the Prior Art

A digital-to-analog converter is a device for converting electrical signals in digital form into their analog equivalent. Such converters are widely used as an interface between a digital computer and a utilization device which cannot be directly operated by digital signals. For example, a digital-to-analog converter is used to convert digital signals generated by a computer into analog signals to control a machine tool in a computer-controlled machine-tool operation.

Digital computers are, of course, inherently accurate machines, their accuracy being limited solely by the size of the digital words that can be accommodated in the registers and accumulators of the computer. Double and triple length words may be used for extended precision, in some instances. The commercial digital-to-analog converters which are currently available, however, are not capable of converting digital input signals into their analog equivalent with the same degree of resolution inherently possessed by the digital input signals. Prior art digital-to-analog converters typically comprise a network of binary-weighted resistors connected to a common summing resistor. A series of switches associated with the binary-weighted resistors selectively connect a regulated voltage to each resistor in the network, in accordance with the digits of the binary word to be converted. The correspondingly weighted currents which flow in the binary-weighted resistors are summed in a summing resistor or in a load to produce the desired analog signal.

Digital-to-analog converters of this type suffer from several disadvantages. First, the energizing voltage for the network of binary-weighted resistors must be highly regulated. This is difficult to do because the voltage source must supply a considerable amount of current and must have a relatively high potential, if any reasonable degree of resolution is required. While voltage sources having a high degree of regulation accuracy are commercially available, these sources are accurate only when supplying a constant or slowly varying load. When connected to a rapidly and constantly varying load, as is found for example in a digital-to-analog converter, the regulating accuracy drops to a much lower figure, typically 0.01%. This drop in accuracy is caused by limitations in the regulating circuitry itself as well as uncertainties as to the internal impedance of the voltage source. Furthermore, such a voltage source is relatively expensive and the above-mentioned limitation on the degree of voltage regulation which can be obtained of necessity limits the resolution of prior art digital-to-analog converter to approximately 13 bits. Additionally, in the prior art, the regulation of the energizing voltage source always occurs *before* the source is switched to energize the binary-weighted resistors. Thus, if electromechanical switching devices are used, contact resistance also becomes limiting. On the other hand, if semiconductor switching is used, the wide manufacturing variations between semiconductors of the same type and the consequent unpredictable voltage drops through the transistors when conducting, are also limiting. The use of field-effect transistors promises to improve this situation slightly, but by not more than one bit, at the very best. Thus, practically speaking, prior art digital-to-analog converters are inherently limited to a resolution of less than 14 bits.

The novel circuitry of the digital-to-analog converter disclosed herein, however, can attain an accuracy and degree of resolution which are both at least one order of magnitude better than that obtained in the prior art. An experimental 18-bit digital-to-analog converter has been constructed and operated. The resolution of this experimental converter is limited only by the state of the art, which at the present time can achieve resistor values and reference voltage sources accurate to one part per million. As the art progresses it will be possible to increase the resolution of digital-to-analog converters constructed according to the principles of this invention as well as those constructed according to the teachings of the prior art, but the novel circuitry disclosed herein is such that the instant digital-to-analog converter will always have an accuracy at least one order of magnitude greater than the prior art.

A preferred embodiment of the invention comprises a network of binary-weighted resistors connected to a summing load. An unregulated voltage source is connected through a corresponding series of switching circuits to each resistor in the network. These switching circuits are selectively energized, in accordance with the digits of the binary number to be converted, and connect the unregulated voltage source to each binary-weighted resistor in the network to thereby generate the analog signal.

An important feature of the invention is the highly accurate regulation of the unregulated energizing voltage *after* this unregulated voltage has been switched to energize each binary-weighted resistor. This regulation is accomplished by a novel parallel-current voltage regulating circuit comprising a highly accurate source of reference potential, and an operational amplifier having a feedback loop connected to supply a compensatory regulating current to the resistor, in parallel with the current supplied by the unregulated source, thereby maintaining the potential developed across the binary-weighted resistor equal to the potential of the reference voltage.

An alternate embodiment of the invention uses a difference amplifier instead of an operational amplifier in the parallel-current voltage regulation circuit. This substitution simplifies the circuitry to such an extent that the components for a low precision, high speed digital-to-analog converter having, for example, a six-bit digital input, may be incorporated on a single monolithic circuit chip. Six-bit converters implemented on single circuit chips exist in the prior art, however, these converters do not use parallel-current voltage regulation *after* switching. Typical prior art circuits require an operational amplifier in the output circuit to provide a reasonable output voltage swing, but this limits the settling time of the circuit. Such an operational amplifier is not needed in the output circuit of a digital-to-analog converter which, according to the present invention, uses parallel-current voltage regulation; and which, therefore, can be built to exhibit a much faster settling time.

BRIEF DESCRIPTION OF THE DRAWINGS

FIG. 1*a* is a schematic diagram of a typical prior art digital-to-analog converter;

FIG. 1*b* is a chart showing the operation of the converter shown in FIG. 1*a* and is helpful in understanding the operation of both the prior art converter shown in FIG. 1*a* and the instant invention;

FIG. 2 is a schematic drawing of a portion of another prior art digital-to-analog converter which illustrates the use of transistorized switching circuitry;

DESCRIPTION OF THE PREFERRED EMBODIMENT

Figures 3A, 3B, 4A, 4B, 5:
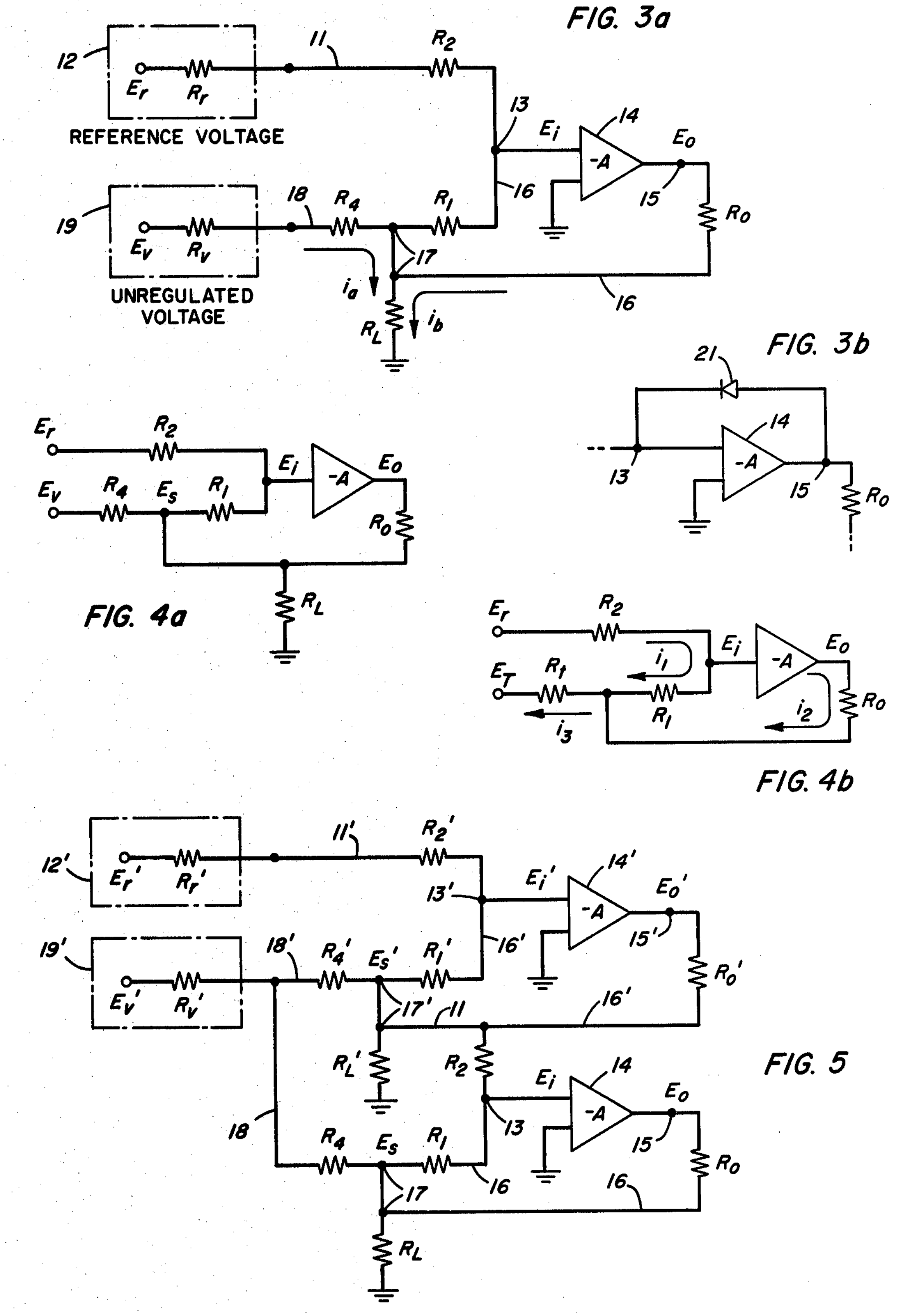
FIG. 3*a* is a schematic drawing of a parallel-current voltage regulating circuit suitable for use with the present invention.
FIG. 3*b* is a schematic drawing illustrating an alternative arrangement for the regulating circuit shown in FIG. 3*a*.
FIG. 4*a* is a simplified schematic drawing of the regulating circuit shown in FIG. 3*a* which is useful in the mathematical analysis thereof.
FIG. 4*b* is another simplified schematic drawing of the regulating circuit shown in FIG. 3*a* which is also useful in the mathematical analysis thereof.
FIG. 5 is a schematic drawing of an alternative embodiment of the parallel-current voltage regulating circuit according to FIG. 3*a* which provides an even greater degree of regulation.

FIG. 1*a* is a schematic drawing of a 3-bit digital-to-analog converter which is typical of the prior art. In this converter a ladder network of three binary-weighted resistors, R, 2R and 4R, is connected at one end via a summing resistor $R_s$ to ground. Switches $S_1$, $S_2$ and $S_3$ represent electromechanical switching devices which can selectively connect the free end of any of the binary-weighted resistors either to ground or to a common reference voltage $+E_{ref}$. The switches $S_1$ through $S_3$ are shown in their normal, or open, position and in that position the switches connect ground to each of the binary-weighted resistors. When operated, however, each of the switches $S_1$ through $S_3$ applies the potential $+E_{ref}$ to the associated binary-weighted resistor causing current flow therethrough. The output voltage, $E_O$, developed across the summing resistor $R_s$ may be calculated by taking the ratio of resistor $R_s$ and all binary-weighted resistors in parallel with it to the sum of that quantity just calculated and the parallel combination of all binary-weighted resistors connected through operated switches to the reference source. Because the binary-weighted resistors have resistance values which increase according to the powers of 2, the output voltage $E_O$ will increase linearly when switches $S_1$ through $S_3$ are selectively closed in binary order.

FIG. 1*b* illustrates the operation of the converter in FIG. 1*a* and shows the condition of switches $S_1$ through $S_3$ for various combinations of input signals as well as the output voltage $E_0$ developed across the summing resistor $R_s$ for each combination. This table assumes that $R_s = R$. If desired, the circuitry can be arranged so that switches $S_1$ through $S_3$ switch the binary-weighted resistors between $-E_{ref}$ and $+E_{ref}$ rather than ground and $+E_{ref}$; however, the linear relationship between the analog output $E_O$ and the binary input will not be affected. In this latter case the graph of $E_O$ versus the binary input would be shifted downward and would pass through the $E_O = 0$ point between the binary input numbers 011 and 100 rather than at the normal 000 point. This type of arrangement is used, for example, if the analog signal is to be used to control the deflection of an electron beam and it is desired that the rest position of the beam be at the center of the cathode ray screen.

By increasing the number of binary-weighted resistors in FIG. 1*a*, it is possible to increase the resolution of such a converter. However, as discussed previously, if more than 12 or 13 binary-weighted resistors are connected to the converter, the change in output voltage $E_O$ across summing resistor $R_s$ as the last switch, corresponding to the least significant digit of the binary number to be converted, is operated, is so small that the reference voltage source $E_{ref}$ must be exceedingly well regulated. This is necessary so that no voltage perturbations will occur in $E_{ref}$ which even approach in magnitude the voltage change across $R_s$ due to a change in the least significant digit of the binary number.

The cost and difficulty of regulating a power supply for use with a digital-to-analog converter having more than 13 bits has already been discussed. The contact resistance of electromechanical switches $S_1$ through $S_n$ must also be less than the change in resistance which occurs as the last binary-weighted resistor is switched in and out of the circuit. This, too, limits the resolution of the digital-to-analog converter shown in FIG. 1*a*.

As previously discussed, this problem can be alleviated somewhat by the use of semiconductor switches. FIG. 2 is a schematic diagram of a portion of a commercially available 13-bit digital-to-analog converter which uses semiconductor switching elements. Referring to FIG. 2, when transistor $T_5$ is turned "On" by the application of a binary "one" signal to the base of transistor $T_1$, the voltage from source $-E_{ref}$ is applied to the binary-weighted resistor 2R, as shown. Similarly, the application of a binary "zero" signal to the base of transistor $T_1$ turns transistor $T_5$ "Off" and transistor $T_4$ On thus connecting a ground to binary-weighted resistor 2R. The alternate operation of transistors $T_4$ and $T_5$ is analogous to the operation of one of the electromechanical switches in FIG. 1*a*. Obviously, the use of transistors in lieu of electromechanical switches eliminates the contact resistance problem but introduces yet another problem in its place. As is well known, when a semiconductor switching device is turned heavily On, it simulates a short circuit in that the resistance of the emitter-collector path is very low. There is, nevertheless, a finite voltage drop across a conducting transistor and this voltage drop must be taken into account in a high resolution digital-to-analog converter. At this time, it is still not possible to manufacture transistors accurately enough so that the collector-emitter voltage drop in the On condition is uniform from sample to sample. Thus, difficulty is experienced in calibrating the various stages of a digital-to-analog converter which uses transistorized switching and if a transistor fails and must be replaced, the entire converter must be recalibrated, as each stage interacts with every other stage. Thus, while the use of transistorized switching circuits, particularly field-effect transistors, may increase the resolution of prior art converters by one or possibly two bits, the limitation imposed by the inability to accurately regulate the reference voltage source after switching occurs are still limiting.

The instant invention successfully eliminates the aforementioned problems and provides a digital-to-analog converter which is significantly superior to anything heretofore attainable. This superiority is attained by the novel concept of regulating an unregulated voltage source *after* it has been switched to generate current flow in a binary-weighted resistor and by using a unique parallel-current voltage regulating circuit to maintain this regulation to a very high degree of accuracy.

FIG. 3*a* depicts one embodiment of the parallel-current voltage regulating circuit utilized in the instant digital-to-analog converter. Referring to the drawing, a circuit 11 supplies a reference voltage from an external voltage source 12 which may advantageously comprise a standard cell having an open-circuit voltage $E_r$ and an internal impedance $R_r$. The standard cell, whose voltage must be accurately known, for example, to at least one part per million, is maintained at a constant temperature by the use of an oven. The circuit 11 connects the reference voltage source 12 to the input 13 of an operational amplifier 14 via a resistor $R_2$. The other input of operational amplifier 14 is grounded. In the experimental digital-to-analog converter actually constructed and operated, a commercially available Analog Devices Model 211 operational amplifier was used. This amplifier has a gain of $A = 10^8$, an input resistance of 0.5 megohms, an output resistance of essentially 0 ohms, and a noise factor of 10 microvolts r.m.s. Obviously one skilled in the art could substitute other types of operational amplifiers for the one used in the experimental embodiment provided that the characteristics are similar. The output 15 of operational amplifier 14 is connected by a feedback loop 16 to the input 13 thereof. An output resistor $R_0$ and a resistor $R_1$ are connected in the feedback loop. $R_L$, the load resistor to be energized, is connected between ground and the juncture of resistors $R_1$ and $R_0$ in feedback loop 16. A second circuit 18 connects an unregulated voltage from an external voltage source 19 to the juncture 17 of resistors $R_1$ and $R_0$ via a resistor $R_4$. The unregulated voltage source 19 advantageously comprises any suitable source having a voltage $E_r$ and an internal impedance $R_r$.

In operation, the unregulated voltage source 19 supplies a current through $R_4$ and $R_L$ to ground, and the voltage $E_s$ which is developed across load resistor $R_L$ at juncture 17 is regulated so that it equals the open circuit voltage $E_r$ of reference voltage source 12 to a high degree of accuracy, regardless of wide variations in the magnitude of the voltage from unregulated voltage source 19. If, as in the illustrative embodiment, the potential of reference source 12 is known to within 1 part per million then resistors $R_1$, $R_2$ and $R_L$ must also be accurate to within one part per million or better.

Assume that unregulated voltage source 19 is supplying a current $i_a$ to load resistor $R_L$ and that the voltage developed across juncture 17 is $E_s$. The potential of unregulated voltage source 19 is "seen" by the input of operational amplifier 14 through resistors $R_4$ and $R_1$, $R_1$ being in feedback loop 16. Input 13 of operational amplifier 14 also sees the potential from reference voltage source 12 through resistor $R_2$. In order that the operational amplifier will regulate over the desired range, the magnitude of resistors $R_2$ and $R_1$ are selected such that $R_1$ is approximately equivalent to the series combination of $R_2$ and the internal resistance $R_r$ of reference voltage source 12. Typically, $R_r$ is negligibly small and, thus in practice, $R_2$ will equal $R_1$. If the potential of unregulated voltage source 19 should vary for any reason, the magnitude of voltage $E_s$ will also tend to vary. This variation is sensed at the input of operational amplifier 14 and an output current is generated in feedback loop 16. A fraction, $i_b$, of this current will flow through load resistor $R_L$. Since $i_b$ is in parallel with $i_a$ the current supplied from feedback loop 16 will tend to alter the magnitude of $E_s$, in an offsetting manner, and maintain $E_s$ equal to the voltage of reference voltage source 12. For this to occur, it is necessary that the magnitude of resistor $R_4$ be selected so that its resistance, together with the internal impedance $R_r$ of unregulated voltage source 19, approximately equals the resistance of load resistor $R_L$. Load resistor $R_L$ will, of course, vary in resistance for each stage of the digital-to-analog converter.

A mathematical analysis of this circuit is set forth below and this analysis proves that the parallel-current voltage regulating circuit shown in FIG. 3 does indeed maintain the voltage $E_s$ developed across load resistor $R_L$ equal to the voltage of reference voltage source 12.

FIG. 4*a* shows the circuit of FIG. 3*a* redrawn in simplified form. The internal resistance $R_r$ of reference voltage source 12 and the internal resistance $R_r$ of unregulated voltage source 19 have been ignored, as typically they are very small compared to $R_2$ and $R_4$, respectively. If they are not small compared to $R_2$ and $R_3$, the following mathematical analysis is still valid provided that $R_2^1$ and $R_4^1$ are substituted in the following proof where $$R_2^1 = R_2 + R_r \quad (1)$$

and $$R_4^1 = R_4 + R_r \quad (2)$$

FIG. 4*a* itself may be further simplified, as shown in FIG. 4*b*, by defining two new quantities $R_T$ and $E_T$ where $$R_T = R_4 R_L/(R_4 + R_L) \quad (3)$$

and $$E_T = R_L/(R_4 + R_L) . E_r \quad (4)$$

Assume that currents $i_1$, $i_2$ and $i_3$ flow as shown in FIG. 4*b*. No current is shown flowing into the operational amplifier as it normally requires no input current.

Now the currents $i_1$, $i_2$ and $i_3$ may be found from the following equations.

$$i_1 = (E_r - E_s)/(R_1 + R_2) \quad (5)$$

$$i_2 = (E_O - E_s)/R_O \quad (6)$$

and $$i_3 = (E_s - E_T)/R_T \quad (7)$$

But $E_O = -A\, E_i$ (8)

and $$E_i = R_1/(R_1 + R_2).\ (E_r - E_s) + E_s \quad (9)$$

$$= R_1/(R_1 + R_2).\ E_r\ 30\ [R_2/(R_1 + R_2)].\ E_s \quad (10)$$

$$\text{Now } i_1 + i_2 = i_3 \quad (11)$$

Therefore, from Equations 5, 6, 7 and 11

$$(E_r - E_s)/(R_1 + R_2) + (E_o - E_s)/R_o = (E_s - E_T)/R_T \quad (12)$$

and from Equations 8 and 10

$$E_o = -A\ R_1/(R_1 + R_2).\ E_r - A\ R_2/(R_1 + R_2).\ E_s \quad (13)$$

From Equations 12 and 13, we obtain $$[(E_r - E_s)/(R_1 + R_2)] - [A\ R_1\ E_r/R_o(R_1+R_2)] - [(A\ R_2\ E_s/R_o(R_1+R_2)] - (E_s/R_o) = (E_s - E_T)/R_T \quad (14)$$

Simplifying this expression we get:

$$E_r\ \ [1/(R_1 + R_2)] - [A\ R_1/R_o(R_1 + R_2)]\ \ + E_T/R_T = E_s\ 1/R_T + 1/R_o + [1/(R_1 + R_2)]\ \ + A\ R_2/R_o(R_1 + R_2) \quad (15)$$

Thus $$[E_r/(R_1 + R_2)]\ [\ 1 - A\ R_1/R_o] + E_T/R_T.1[(R_1 + R_2)/(R_1 + R_2)] = [E_s/(R_1 + R_2)]\ \ [(R_o + R_T)\ (R_1 + R_2)/R_o\ R_T] + 1 + A\ R_2/R_o \quad (16)$$

Simplifying we get $$E_r\ (R_oR_T - A\ R_1R_T) + E_T\ (R_1 + R_2)\ R_o = E_s\ [(R_o + R_T)(R_1 + R_2) + R_oR_T + A\ R_2R_T] \quad (17)$$

Therefore $$E_s = E_r\ (R_oR_T - A\ R_1R_T)/[(R_o + R_T)(R_1 + R_2) + R_oR_T + A\ R_1R_T] + E_T\ (R_1 + R_2)\ R/[(R_o + R_T)(R_1 + R_2) + R_oR_T + A\ R_1R_T] \quad (18)$$

Now from Equation 3

$$R_T = R_4R_L/(R_4 + R_L) \quad (19)$$

and $R_{4\ typical} \approx$ 300 ohms
$R_{L\ typical} \approx$ 500 ohms

Thus $R_{T\ typical} \approx (300 \times 500)/800 = 200$ ohms

Further, in a typical digital-to-analog converter stage $R_{0\ typical} \approx$ 500 ohms
$R_{1\ typical} \approx$ 10,000 ohms
$R_{2\ typical} \approx$ 10,000 ohms and $A_{typical} \approx 10^8$ Substituting these values into Equation 18, we get $$E_s = \frac{E\nabla[(500)(200) - (10^8)(10,000)(200)]}{[(700)(20,000) + (100,000) + (10^8)(10,000)(200)]} + \frac{E_T(20,000)(500)}{[(700)(20,000) + (100,000) + (10^8)(10,000)(200)]}$$

$$E_s = \frac{E_r[10 - (200)(10^8)]}{[1400 + 10 + 200\ (10^8)]} + \frac{E_T(100)}{140 + 1 + 20 + 10^8}$$

Therefore $$E_s \approx [-E_r(10^8)/(10^8)] + E_T/(10^7)$$

or $$E_s \approx -E_r + (E_T/10^7)$$

Ignoring this latter term, which is exceedingly small, we get $E_s = -E_r$ and the effect of $E_T$ (and thus $E_r$) upon $E_s$ may be ignored.

Another important feature of the parallel-current voltage regulating circuit shown in FIG. 3*a* is its excellent response to transient switching pulses. An experimental regulator, constructed in accordance with this invention, was found to have a settling time of less than one microsecond. This figure is suitable for virtually all applications which require a digital-to-analog converter of this degree of resolution.

FIG. 3*b* shows a modified version of the circuit disclosed in FIG. 3*a*. In FIG. 3*b* a diode 21 is connected between output lead 15 and input 13 and poled so that if the output voltage $E_o$ of operational amplifier 14 goes positive, diode 21 conducts shorting out the operational amplifier 14. Obviously, diode 21 could be poled in the opposite direction if it is desired to short-out operational amplifier 14 when the output voltage goes negative.

It is possible to improve still further the parallel-current voltage regulating circuit shown in FIG. 3*a*. As shown in FIG. 5, this is accomplished by substituting for the external reference voltage source 12 in FIG. 3*a*, an unregulated voltage source which itself has been regulated by a parallel-current voltage regulating circuit of the type disclosed in FIG. 3*a*. This process may be repeated over and over again although practical considerations make the use of more than two parallel-current voltage regulating circuits in "tandem" of doubtful value. Referring now to FIG. 5, a circuit 11' connects a reference voltage source 12' to a resistor $R_2$' thence to the input 13' of an operational amplifier 14'. A feedback loop 16' which includes an output resistor $R_o$' and a resistor $R_1$' connects the output 15' of operational amplifier 14' to the input 16'. A load resistor $R_L$' is connected to the juncture 17' of resistors $R_o$' and $R_1$' and is supplied with current from an external unregulated source 19' through a resistor $R_4$'.

The operation of the portion of the circuit disclosed in FIG. 5 described so far is identical with that described for FIG. 3*a* and will not be repeated here. Suffice it to say that the voltage $E_s$' developed across load resistor $R_L$' is held to the voltage of reference source 12'. Importantly, no significant current is drawn from the standard cell in reference source 12'.

The regulated voltage $E_s^1$ developed across resistor $R_L^1$ is next connected via circuit 11 and resistor $R_2$ to the input of a second operational amplifier 14 and the remainder of its circuit and the operation thereof is identical to that described with reference to FIG. 3*a*. The circuit of FIG. 5 accomplishes the substitution of $E_s^1$, the voltage developed across resistor $R_L^1$, for the reference voltage source 12 normally used. Unlike a standard cell, however, the circuit arrangement of FIG. 5 can supply significant current from the new reference source $E_s^1$ which increases the range and accuracy of overall regulation.

Figure 6:
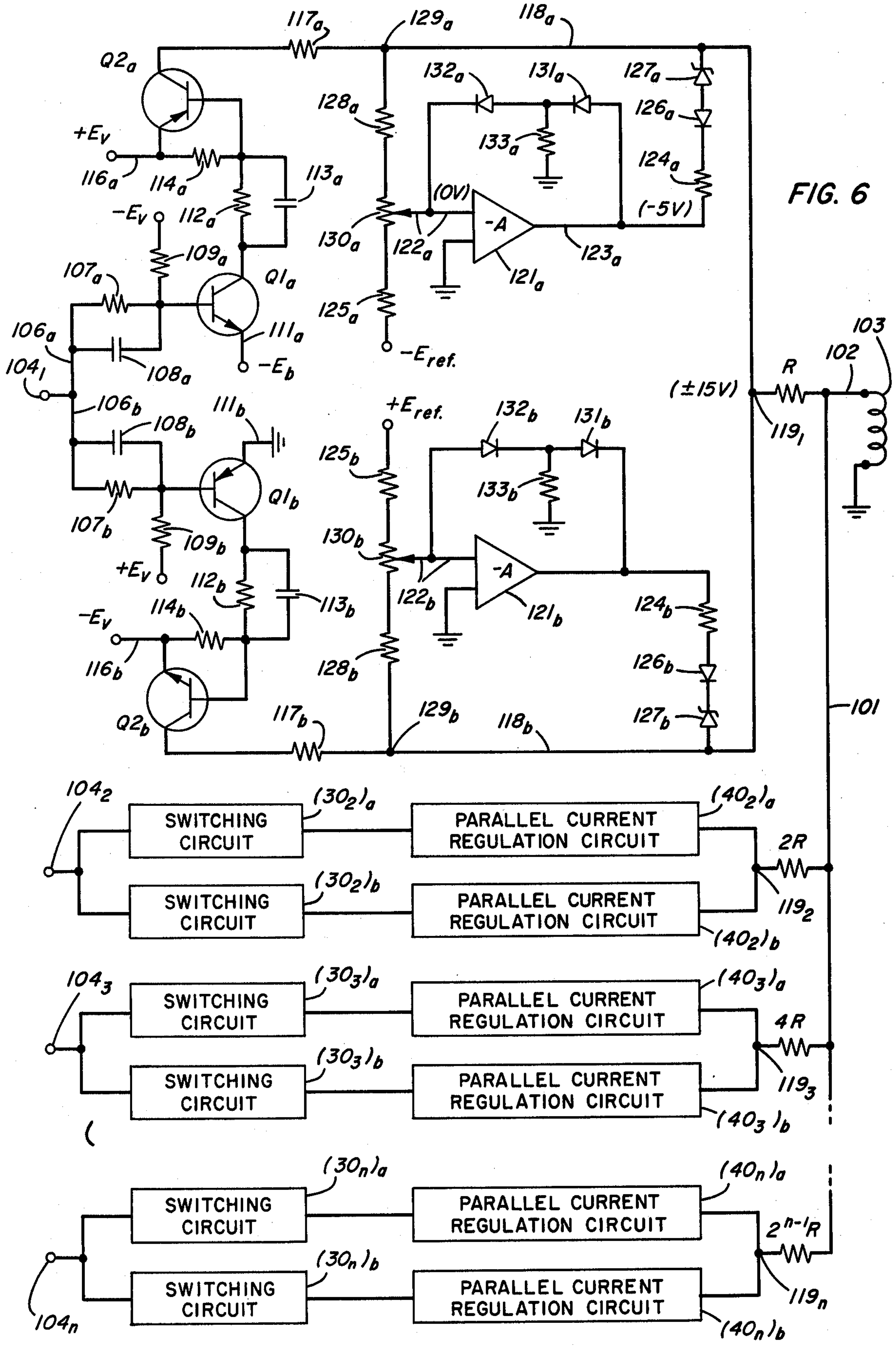
FIG. 6 is a schematic drawing of an illustrative embodiment of a digital-to-analog converter according to the present invention.

FIG. 6 shows a preferred embodiment of a digital-to-analog converter according to the invention. With the exception of minor changes in the resistance of some components caused by a corresponding change in the resistance of the associated binary-weighted resistor, each stage of the converter is identical, thus only the first is illustrated and described in detail.

As discussed in connection with FIG. 2, in the preferred embodiment, the potential applied to the various binary-weighted resistors in the ladder network is switched between $+E_r$ and $-E_r$. However, it will be appreciated that the circuitry disclosed is equally suitable for switching between $\pm E_r$ and ground, should this be desired. If this were done, it would, of course, be necessary to regulate the ground potential, as well as the supply source, if a high degree of resolution is required.

In FIG. 6 a network 101 comprises a plurality of binary-weighted resistors R, 2R, 4R. . . $2^{n-1}$R connected at one end. Network 101 is connected by a lead 102, to an external load 103 which, in the preferred embodiment shown, is the deflection coil of an electron-beam deflection device. The series combination of load 103 and one of the binary-weighted resistors corresponds to load resistor $R_L$ in FIG. 3*a*. It will be appreciated, however, that load 103 may be any external load capable of working with the digital-to-analog converter disclosed.

Input $104_1$ is connected by leads 106*a* and 106*b* to essentially identical upper and lower halves of the first stage of the converter. Again, for simplicity, only the upper half of the first stage will be discussed in detail, although both are illustrated. The circuitry and operation of the lower half is entirely analogous to the operation of the upper half, provided, of course, that appropriate corrections are made for the change in polarity of the supply source.

Returning now to the input $104_1$, lead 106*a* connects the input via a resistor 107*a* and a capacitor 108*a* to the base of transistor Q1*a* . Resistor 109*a* connects biasing potential from source $-E_r$ to the base of transistor Q1*a*. The emitter of transistor Q1*a* is connected to a second biasing potential $-E_B$ via a lead 111*a*. The collector of transistor Q1*a* is connected via a resistor 112*a* and a capacitor 113*a* to the base of transistor Q2*a*. A biasing resistor 114*a* connects the base of transistor Q2*a* to its emitter and thence via a lead 116*a* to an unregulated voltage source $+E_r$. The collector of transistor Q2*a* is connected by a resistor 117*a* to a feedback loop 118*a*, a junction $119_1$ and the first binary-weighted resistor R.

The concept of regulating the energizing voltage sources $+E_r$ and $-E_r$ after they have been selectively switched to energize the binary-weighted resistors in ladder network 101 has been previously discussed. To accomplish this regulation, after switching, an operational amplifier 121*a* having an input 122*a* and an output 123*a* is connected via an output resistor 124*a* and the serial connection of a diode 126*a* and a Zener-diode 127*a* to feedback loop 118*a*. A resistor 128*a* connects the junction 129*a* of feedback loop 118*a* and a resistor 117*a* to one end of a trimmer resistor 130*a* and via the slider arm thereof to input 122*a*. The other end of trimmer resistor 130*a* is connected via a resistor 125*a* to an external reference voltage $-E_{ref}$. The output 123*a* of operational amplifier 121*a* is also connected via a pair of diodes 131*a* and 132*a* to the input 122*a* thereof. A resistor 133*a* connects the midpoint of diodes 131*a* and 132*a* to ground.

As previously discussed, the lower half of the first converter stage is essentially identical to the upper half just described. However, it will be noted that the polarity of transistors Q1*a* and Q1*b* and Q2*a* and Q2*b* are reversed. Similarly, lead 111*b* connects the emitter of transistor Q1*b* to ground rather than to the biasing voltage $-E_B$ and resistor 109*b* connects the base of transistor Q1*b* to the biasing potential $+E_r$ rather than $-E_r$. Similarly, lead 116*b* connects the emitter of transistor Q2*b* to $-E_r$ rather than $+E_r$ and the polarity of diodes 126*b*, 131*b*, 132*b* and Zener diode 127*b* are also reversed.

In operation, assume that a very low potential, illustratively zero volts, is applied to input $104_1$ and is indicative of a binary "one" input to the first stage of the converter. Because the emitter of transistor Q1*b* is grounded, when zero volts is applied to the base thereof there will be, of course, zero volts on the base-emitter junction of transistor Q1*b*. Thus, the large positive potential $+E_r$ which is applied to the base of transistor Q1*b* via biasing resistor 109*b* maintains transistor Q1*b* positively turned Off. This is turn keeps transistor Q2*b* Off which inhibits the application of the $-E_r$ voltage present on lead 116*b* to the junction point $119_1$ and binary-weighted resistor R.

Resistors 107*a* and 107*b* prevent transistors Q1*a* and Q1*b* from loading down the input signal on input $104_1$ and capacitors 108*a* and 108*b* are provided to speed-up the transient response of transistors Q1*a* and Q1*b*. The zero potential which is applied, via lead 106*a*, to the base of transistor Q1*a* turns transistor Q1*a* heavily On, by virtue of the negative potential $-E_B$ connected to the emitter thereof by lead 111*a*. The resistor 109*a* which connects the base of transistor Q1*a* to biasing source $-E_r$ plays no part in the operation of the circuit at this time. This connection is provided to ensure that transistor Q1*a* is positively turned Off when the input on lead $104_1$ corresponds to a binary "zero" and transistors Q1*b* and Q2*b* are conducting.

When transistor Q1*a* is turned On the potential at the collector thereof becomes approximately equal to the negative potential $-E_B$ which is present on its emitter. The base of transistor Q2*a* on the other hand, is maintained positive because of the positive potential $+E_r$ present on its emitter via lead 116*a*. Current therefore flows down through current-limiting resistor 112*a* into the now conducting transistor Q1*a* and this downward current flow draws current from the base of transistor Q2*a* and turns transistor Q2*a* heavily On permitting current to flow from source $+E_r$ through resistor 117*a* to junction $119_1$ and the first binary-weighted resistor R, thence via summing circuit 102 to the load 103.

The value of resistor 112*a* is selected to limit the current flow through transistor Q1*a* to a reasonable figure and capacitor 113*a* is provided to speed-up the transient response of transistors Q1*a* and Q2*a*.

As previously discussed with reference to FIG. 3*a*, the potential at junction 129*a* is regulated by means of operational amplifier 121*a* and feedback loop 118*a* so that the voltage at junction 129*a* is maintained equal to the potential of reference voltage $-E_{ref}$. Trimmer resistor 130*a*, which is typically a 20-turn wire wound potentiometer of approximately 1 ohm resistance, is provided for alignment purposes so that the potential at input 122*a* to operational amplifier 121*a* is maintained at zero volts.

Also as previously discussed in connection with FIG. 3*a*, if for some reason the potential at junction 129*a* should vary from the reference potential $-E_{ref}$, a compensating, parallel current is supplied to junction $\mathbf{119}_1$ and binary resistor R from feedback loop 118*a* to maintain the voltage at junction 129*a* and hence junction $\mathbf{119}_1$ constant. The Zener diode 127*a*, which is connected in the feedback loop 118*a*, is provided to increase the range of regulation and this diode drops approximately 75% of the voltage difference between the output of operational amplifier 121*a*, which is typically −5 volts, and the potential at junction $\mathbf{119}_1$, which is typically +15 volts, the remaining 5 volts being dropped across resistor 124*a*. Diode 126*a* is provided to block leakage current from operational amplifier 121*a* when current is being supplied to resistor R by the lower half of the circuit, which, of course, only occurs when a binary zero signal is present an input $\mathbf{104}_1$. Diodes 131 *a* and 132*a* and resistor 133*a* are connected across operational amplifier 121*a* to short it out in this latter condition when operational amplifier 121*b* is functioning.

The operation of the circuit when a binary zero signal is applied to input $\mathbf{104}_1$ is entirely analogous. The potential applied to input $\mathbf{104}_1$ in that case is typically −3 volts, thus the biasing potential $-E_r$ applied to the base of transistor Q1*a* will turn Q1*a* Off which, in turn, will turn transistor Q2*a* Off disconnecting the positive source $+E_r$ from junction $\mathbf{119}_1$ and binary-weighted resistor R. The −3 volt potential applied at input $\mathbf{104}_1$ is passed to the base of transistor Q1*b* via lead 106*b* and, by virtue of the ground present on the emitter of transistor Q1*b* from lead 111*b*, turns transistor Q1*b* On. This, in turn, turns Q2*b* On passing the $-E_r$ potential on lead 116*b* to junction $\mathbf{119}_1$ and binary-weighted resistor R thence via summing circuit 102 to the load 103 as before. Operational amplifier 121*b* and feedback loop 118*b* act to maintain the potential at junction 129*b* equal to the potential $+E_{ref}$ applied to the input of operational amplifier 121*b*, in a manner entirely analogous to the operation of the upper half of the circuit.

As previously discussed, under this condition, operational amplifier 121*a* will be shorted by diodes 132*a* and 131*a* and diode 126*a* will prevent any leakage to junction $\mathbf{119}_1$ from the upper half of the circuit.

The converter stage which has been illustrated and discussed in detail in the most significant stage in the converter. The stages which correspond to the lesser significant digits of the number to be converted are essentially identical except for minor changes in resistance values, etc. Thus, the application of input signals to input circuits $\mathbf{104}_2$ through $\mathbf{104}_2$ and the operation of switching circuits $\mathbf{30}_{2(a)}$ through $\mathbf{30}_{n(a)}$ and $\mathbf{30}_{2(b)}$ through $\mathbf{30}_{n(b)}$ as well as parallel-current voltage regulating circuits $\mathbf{40}_{2(a)}$ through $\mathbf{40}_{n(a)}$ and $\mathbf{40}_{2(b)}$ through $\mathbf{40}_{n(b)}$ need not be discussed in detail.

It is essential, in the first stage of the converter, that resistors 125*a*, 125*b*, 128*a*, 128*b* as well as binary-weighted resistor R be as accurate as the potential of the reference voltages $+E_{ref}$ and $-E_{ref}$. In the illustrative embodiment of the invention actually constructed, these potentials were known to within 1 part per million. In succeeding less-significant stages of the converter, these tolerances may be reduced, for example, to 2 parts per million, 4 parts per million, 8 parts per million, etc. As previously discussed, the reference voltages $+E_{ref}$ and $-E_{ref}$ are advantageously obtained from a standard cell. The standard cell is advantageously maintained in a controlled environment in a temperature controlled oven. It may also be advantageous, under some circumstances, to maintain resistors 125*a*, 125*b*, 128*a* and 128*b* and the binary-weighted resistors in a temperature controlled oven, although this has not been found necessary in the experimental 18-bit digital-to-analog converter actually constructed. One advantage of switching the binary-weighted resistors between $+E_r$ and $-E_r$ rather than $+E_r$ and ground is that there is always a current in the binary-weighted resistors, regardless of the input signals to the various stages. Thus, the binary-weighted resistors are subject to constant $i^2R$ heating and, therefore, less likely to alter their resistance value, which would, of course, affect the accuracy of the digital-to-analog conversion.

Figure 7:
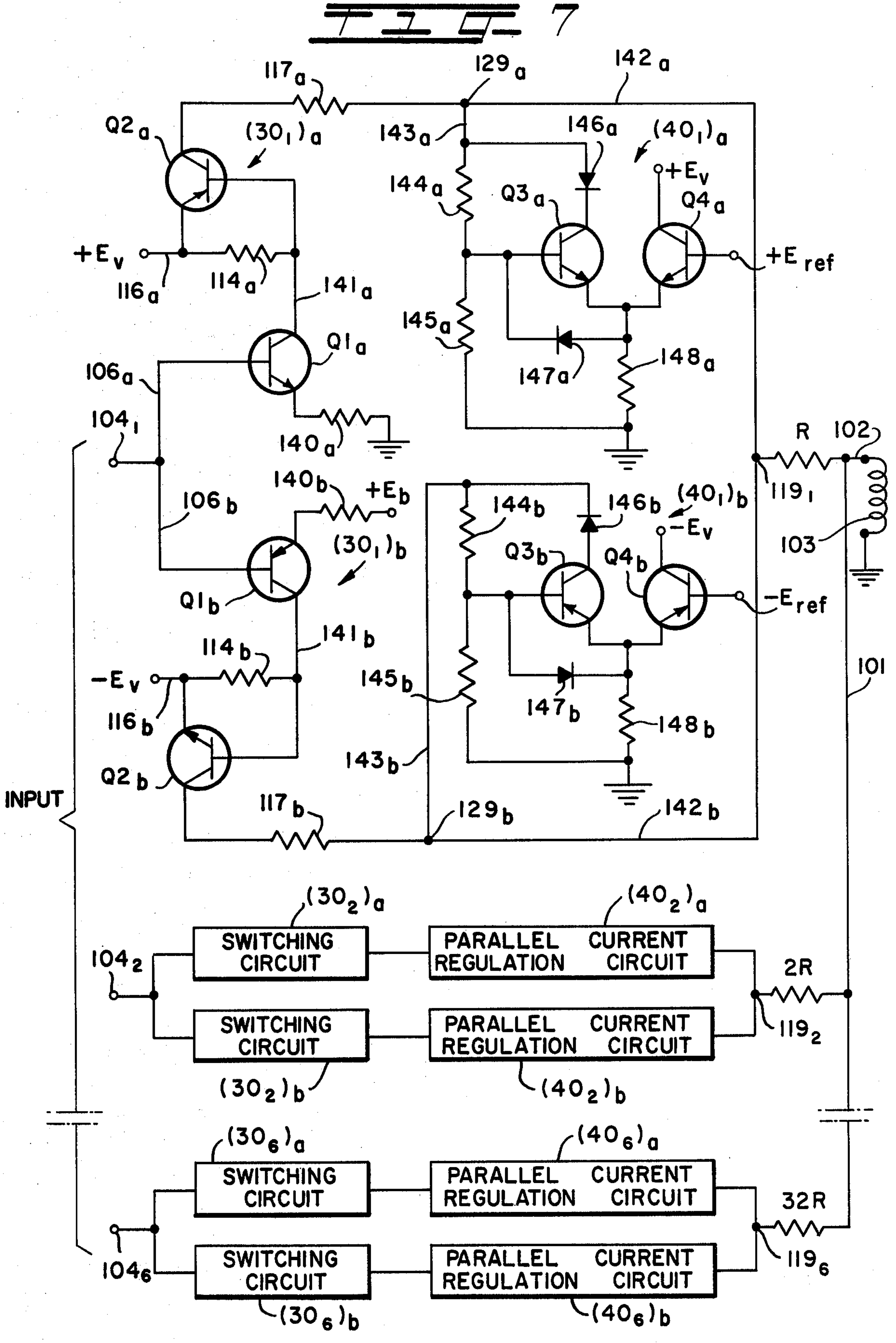
FIG. 7 is a schematic drawing of a low precision, high-speed, 6-bit digital-to-analog converter, using difference amplifiers for regulation.

FIG. 7 shows an alternate embodiment of the digital-to-analog converter, according to this invention, in which difference amplifiers are substituted for operational amplifiers 121*a* and 121*b*, shown in FIG. 6, and in which certain changes are made in the switching circuits. The 6-bit converter shown in FIG. 7 encompasses a number of components which may be fabricated on a single monolithic circuit chip, using presently available technology. However, it will be apparent to the practitioner that converters with more than six input bits could be built on a plurality of monolithic chips, or on a single larger chip, if fabrication technology permits. Conveters with less than 6 input bits may also be constructed.

In FIG. 7, certain elements are numbered identically to like elements in FIG. 6, as the overall operation of the circuit in FIG. 7 is similar to the operation of the circuit in FIG. 6. However, switching circuits 30 and parallel-current voltage regulation circuits 40 in the schematic of FIG. 7 are different from like elements in the circuit of FIG. 6. These differences will become evident from the description of FIG. 7 which follows.

Referring now to FIG. 7, simplifications have been made in switching circuits 30 to eliminate capacitors and to reduce the number of resistors. Switching circuits 30 are now shown for operation with an input signal having either a positive voltage level, typically +3 volts, or ground as its two input states. Such an input signal is compatible with the positive signal levels currently used in systems using monolithic circuits. However, the modifications necessary to permit switching circuits 30 to operate with negative-going or bipolar input signals would be apparent to the skilled practitioner.

As in the previous description, only the upper half of the most significant stage of the converter will be described in detail. Input $\mathbf{104}_1$, is connected by lead 106*a* to the base of transistor Q1*a*. The emitter of transistor Q1a is connected through resistor 140*a* to ground. The collector of transistor Q1*a* is connected by lead 141*a* to the base of transistor Q2*a*. Biasing resistor 114*a* connects the base of transistor Q2*a* to its emitter, which is also connected to unregulated voltage source $+E_r$. The collector of transistor Q2*a* is connected through resistor 117*a* to leads 142*a* and 143*a*. Lead 142*a* connects to point $119_1$, and binary-weighted resistor R which further connects to summing circuit 102, and load 103. Lead 143*a* connects through resistor 144*a* to the base of transistor Q3*a*, and through diode 146*a* to the collector of transistor Q3*a*. The base of transistor Q3*a* is also connected to ground through resistor 145*a*. Diode 147*a* is connected between the emitter and base of transistor Q3*a*. The emitters of transistors Q3*a* and Q4*a* are connected together, and to ground through resistor 148*a*. The base of transistor Q4*a* is connected to reference voltage $+E_{ref}$, and the collector of transistor Q4*a* is connected to unregulated voltage source $+E_r$.

As previously stated, the lower half of the first stage is essentially identical to the upper half just described. However, it will be noted that transistors Q1*b*, Q2*b*, Q3*b* and Q4*b* in the lower half are of opposite polarity compared to their counterparts Q1*a*, Q2*a*, Q3*a*, and Q4*a* in the upper half. Also, the emitter of transistor Q2*b* and the collector of transistor Q4*b* connect to an unregulated voltage source $-E_r$ rather than $+E_r$. Similarly, the base of transistor Q4*b* is connected to reference voltage $-E_{ref}$ rather than $+E_{ref}$. The emitter of transistor Q1b is connected through resistor 140b to biasing voltage source $+E_B$ rather than ground. The magnitude of $+E_B$ is chosen so that during the application of a positive voltage level on input $104_1$, transistor Q1*b* will be turned Off, and during the application of a ground or zero voltage level on input 104, transistor Q1*b* will be turned On. Diodes 146*b* and 147*b* in the lower half are reversed with respect to their counterparts in the upper half.

In operation, assume that a positive voltage level appears on input $104_1$, which is indicative of a binary one input to the first stage of the converter. Transistor Q1*b* will be turned Off by this positive voltage level. This in turn maintains transistor Q2*b* Off which inhibits the application of voltage $-E_r$ to junction point 119, and binary-weighted resistor R.

The positive voltage level on input $104_1$ is applied via lead 106*a* to the base of transistor Q1*a*. Since the emitter of transistor Q1*a* is connected through resistor 140*a* to ground, a current will flow through the emitter-base junction of transistor Q1*a*. This emitter-base current turns transistor Q1*a* On.

When transistor Q1*a* is turned On, current flows from source $+E_r$ through resistor 114*a*, the collector of Q1*a*, and resistor 140*a* to ground. Resistor 140*a* limits the magnitude of this current. The resulting voltage drop across resistor 114*a* causes current to flow through the emitter-base junction of transistor Q2*a*, turning transistor Q2*a* heavily On, permitting current to flow from source $+E_r$ through resistor 117*a* to junction $119_1$ and binary-weighted resistor R to summing circuit 102 and load 103.

The potential at junction 129*a* is regulated by means of the difference amplifier comprising parallel-current voltage regulation circuit $(40_1)$a so that the voltage at junction 192*a* is maintained constant with respect to reference voltage $+E_{ref}$. Typically, $+E_{ref}$ will be half the magnitude of the voltage to be maintained at junction 129*a*. Resistors 144*a* and 145*a* are chosen so that the voltage appearing on the base of transistor Q3*a* will also be approximately half the voltage at junction 129*a*. The voltage on the emitters of transistors Q3*a* and Q4*a* will be maintained at slightly less than $+E_{ref}$ by transistor Q4*a*. If the voltage at junction 129*a* increases for any reason, the voltage on the base of transistor q3*a* will also increase momentarily, causing increased current to flow through the emitter-base junction of Q3*a*. This increased emitter-base current in transistor Q3*a* causes a corresponding increase in collector current, which flows from junction 129*a* through diode 146*a*. This increased collector current must be drawn through resistor 117*a*, causing a larger voltage drop thereacross, decreasing the voltage at junction 129*a*. The converse action results if the voltage at junction 129*a* decreases for any reason. It can be seen, therefore, that the difference amplifier comprising regulation circuit $(40_1)$a regulates the voltage at point 129*a* by varying the current flowing in lead 143*a*, resulting in parallel-current voltage regulation.

Diodes 146*a* and 147*a* are provided to protect transistor Q3*a* when junction 129 is at the negative potential which results when a binary zero appears at input 104. Diode 146*a* protects the collector-base junction of Q3*a*, and diode 147*a* protects the emitter-base junction of transistor Q3*a* when junction 129*a* becomes negative.

The operation of the circuit when a binary zero signal is applied to input $104_1$ is analogous to the operation described above for a binary one. The potential applied to input $104_1$ to represent a binary zero is typically close to zero volts, or ground potential, which thereby turns transistor Q1*a* Off and transistor Q1*b* On. Transistor Q2*b* is thereupon turned On, passing the $-E_r$ potential through resistor 117*b* to point $119_1$, resistor R, summing circuit 102, and load 103. Parallel-current voltage regulation circuit $(40_1)b$ maintains the voltage at junction 129*b* at the correct negative potential in a manner entirely analogous to the action of regulation circuit $(40_1)a$ described above.

The operation of the other stages in the converter shown in FIG. 7 is identical to the operation of the most significant stage described above, and need not be described in detail.

It can be seen that the operation of the alternate embodiment digital-to-analog converter, using difference amplifiers to perform parallel-current voltage regulation, is similar to the operation of the preferred embodiment using operational amplifiers for regulation. However, the alternate embodiment typically cannot provide the same degree of precision as the preferred embodiment. As previously mentioned, the preferred embodiment is capable of operation in configurations of up to 18 bits having a conversion accuracy of 4 parts per million. The alternate embodiment converter is intended for use in applications needing fewer bits, typically 6; and lower conversion accuracies, typically 1 part per thousand. The advantage of the alternate embodiment converter, however, which distinguishes it from prior art converters, is its faster conversion time.

While there has been shown and described the novel features of the invention according to a preferred embodiment and an alternate embodiment, it will be understood that various omissions and substitutions in the circuitry illustrated and in its operation may be made by those skilled in the art without departing from the spirit of the invention.

What is claimed is:

1. In a digital-to-analog converter of the type including a plurality of binary-weighted resistors each having a first terminal connected to a common load and a second terminal selectively connectable by either a first switching circuit to a source of positive energizing voltage or a second switching circuit to a source of negative energizing voltage, the improvement comprising for each binary-weighted resistor:

first means for comparing the voltage at the second terminal with voltage from a first external reference source;

means for supplying a first current to the second terminal and, responsive to the first comparing means, for varying the first current to maintain the voltage at the second terminal substantially constant regardless of variations in the voltage of the positive energizing source;

second means for comparing the voltage at the second terminal with a voltage from a second external reference source; and means for supplying a second current to the second terminal and, responsive to the second comparing means, for varying the second current to maintain the voltage at the second terminal substantially constant regardless of variations in the voltage of the negative energizing source; wherein the first external reference source is positive;

the second external reference source is negative;

the combination of the first comparing means and the first supplying and varying means comprises:

a first difference amplifier having a sensing input, a reference input connected to the first external reference source, and an output;

a first circuit connected between the sensing input of the first difference amplifier and the second terminal of the binary-weighted resistor; and a second circuit connected between the output of the first difference amplifier and the second terminal of the binary-weighted resistor; and the combination of the second comparing means and the second supplying and varying means comprises:

a second difference amplifier having a sensing input, a reference input connected to the second external reference source, and an output;

a third circuit connected between the sensing input of the second difference amplifier and the second terminal of the binary-weighted resistor; and a second circuit connected between the output of the second difference amplifier and the second terminal of the binary-weighted resistor.

2. A digital-to-analog converter according to claim 1, wherein said first and second switching circuits each include a resistor having a value chosen so that the sum of the resistance of each switching circuit and the internal resistance of each corresponding energizing voltage source substantially equals the resistance of said binary-weighted resistor.

3. In a digital-to-analog converter of the type including a plurality of binary-weighted resistors each having a first terminal connected to a common load and a second terminal selectively connectable by either a first switching circuit to a source of positive energizing voltage or a second switching circuit to a source of negative energizing voltage, the improvement comprising, for each binary-weighted resistor:

first means for comparing the voltage at the second terminal with voltage from a first external reference source;

means for supplying a first current to the second terminal and, responsive to the first comparing means, for varying the first current to maintain the voltage at the second terminal substantially constant regardless of variations in the voltage of the positive energizing source;

second means for comparing the voltage at the second terminal with a voltage from a second external reference source; and means for supplying a second current to the second terminal and, responsive to the second comparing means, for varying the second current to maintain the voltage at the second terminal substantially constant regardless of variations in the voltage of the negative energizing source; wherein the first external reference source is negative;

the second external reference source is positive;

the first current supplying and varying means comprises:

a first operational amplifier having an input and an output, and a first circuit connecting the output of the first operational amplifier to the second terminal of the binary-weighted resistor;

the first comparing means comprises:

a second circuit for connecting the input of the first operational amplifier to a negative reference source, a third circuit connecting the input of the first operational amplifier to the second terminal of the binary-weighted resistor, and means for disabling the first operational amplifier when the second terminal is connected by the second switching circuit to a negative energizing source;

the second current supplying and varying means comprises:

a second operational amplifier having an input and an output, and a fourth circuit connecting the output of the second operational amplifier to the second terminal of the binary-weighted resistor; and the second comparing means comprises:

a fifth circuit for connecting the output of the second operational amplifier to the positive reference source, a sixth circuit connecting the input of the second operational amplifier to the second terminal of the binary-weighted resistor, and means for disabling the second operational amplifier when the second terminal is connected by the first switching circuit to a positive energizing source.

4. A digital-to-analog converter according to claim 3 wherein the second circuit is a first resistor, the third circuit is a second resistor substantially equal in resistance to the first resistor, the fifth circuit is a third resistor, and the sixth circuit is a fourth resistor substantially equal in resistance to the third resistor.

5. A digital-to-analog converter according to claim 4 wherein said first and second switching circuits each include a series-connected resistor whose resistance is selected such that the sum of the resistance of the corresponding switching circuit and the internal impedance of the energizing voltage source connected thereto is substantially equal to the resistance of the associated binary-weighted resistor.

* * * * *

UNITED STATES PATENT OFFICE
CERTIFICATE OF CORRECTION

Patent No. 3,877,021 Dated April 8, 1975

Inventor(s) Jaan Raamot

It is certified that error appears in the above-identified patent and that said Letters Patent are hereby corrected as shown below:

Column 7, equation (10),
" $= R_1/(R_1 + R_2) \cdot E_r$ 30 $[R_2/(R_1 + R_2)] \cdot E_s$" should read
-- $= [R_1/(R_1 + R_2)] \cdot E_r + [R_2/(R_1 + R_2)] \cdot E_s$--;

equation (15), that portion of the equation reading
" $= E_s\ 1/R_T + 1/R_0 + [1/(R_1 + R_2)] + A\ R_2/R_0(R_1 + R_2)$"
should read
-- $= E_s\ [1/R_T + 1/R_0 + 1/(R_1 + R_2)] + A\ R_2/R_0(R_1 + R_2)$--;

Column 8, line 5, that portion of the equation reading "E∇[(500)(200)" should read --$E_v$[(500)(200)--. Column 10, line 35, "This is turn" should read --This in turn--. Column 11, line 31, "an input $104_1$." should read --at input $104_1$.--; line 60, "in the most" should read --is the most--; line 65, "$104_2$ through $104_2$" should read --$104_2$ through $104_{2N-1}$--. Column 12, line 23, "rather than $+E_V$" should read --rather than $\pm E_V$--; line 42, "Conveters" should read --Converters--. Column 14, line 7, "q3a" should read --Q3a--.

Signed and Sealed this

*sixteenth* Day of *December 1975*

[SEAL]

*Attest:*

RUTH C. MASON
*Attesting Officer*

C. MARSHALL DANN
*Commissioner of Patents and Trademarks*

UNITED STATES PATENT OFFICE
CERTIFICATE OF CORRECTION

Patent No. 3,877,021 Dated April 8, 1975

Inventor(s) JAAN RAAMOT

It is certified that error appears in the above-identified patent and that said Letters Patent are hereby corrected as shown below:

In the specification, Column 6, equation (4),

"$E_T = R_L/(R_4 + R_L) . E_V$" should read --$E_T = [R_L/(R_4 + R_L)].E_V$--.

Column 7, equation (10),

" $= R_1/(R_1 + R_2) . E_r \; 30 \; [R_2/(R_1 + R_2)] . E_s$" should read

-- $= [R_1/(R_1 + R_2)] . E_r + [R_2/(R_1 + R_2)] . E_s$ --;

equation (13),

"$E_0 = -A\ R_1/(R_1 + R_2) . E_r -A\ R_2/(R_1 + R_2) .\ E_s$" should read

--$E_0 = -[A\ R_1/(R_1 + R_2)] . E_r -[A\ R_2/(R_1 + R_2)] . E_s$--;

equation (15), that portion of the equation reading

" $= E_s\ 1/R_T + 1/R_0 + [1/(R_1 + R_2)] + A\ R_2/R_0(R_1 + R_2)$"

should read

-- $= E_s\ [1/R_T + 1/R_0 + 1/(R_1 + R_2)] + A\ R_2/R_0(R_1 + R_2)$--;

equation (16), that portion of the equation reading

"... $E_T/R_T\ .\ 1[(R_1 + R_2)/$..." should read

--... $[E_T/R_T]\ .\ 1[(R_1 + R_2)/$...--; and that portion of the equation reading "... $/R_0\ R_T] + 1 + A\ R_2/R_0$" should read

--... $/R_0\ R_T + 1 + A\ R_2/R_0]$--.

Signed and Sealed this

*tenth* Day of *February 1976*

[SEAL]

*Attest:*